US011251792B2

(12) United States Patent
Anegawa

(10) Patent No.: US 11,251,792 B2
(45) Date of Patent: Feb. 15, 2022

(54) SINGLE-POLE DOUBLE-THROW SWITCH

(71) Applicant: SUMITOMO ELECTRIC INDUSTRIES, LTD., Osaka (JP)

(72) Inventor: Osamu Anegawa, Osaka (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 103 days.

(21) Appl. No.: 16/692,214

(22) Filed: Nov. 22, 2019

(65) Prior Publication Data
US 2020/0169255 A1 May 28, 2020

(30) Foreign Application Priority Data
Nov. 27, 2018 (JP) .............. JP2018-221483

(51) Int. Cl.
H03K 17/693 (2006.01)
H03K 17/62 (2006.01)
H01Q 23/00 (2006.01)
H01P 1/15 (2006.01)
H03K 17/76 (2006.01)

(52) U.S. Cl.
CPC ............ H03K 17/693 (2013.01); H01P 1/15 (2013.01); H01Q 23/00 (2013.01); H03K 17/6285 (2013.01); H03K 17/76 (2013.01)

(58) Field of Classification Search
CPC .... H01P 1/00; H01P 1/15; H01Q 1/00; H01Q 1/243; H01Q 21/00; H01Q 21/28; H01Q 23/00; H01Q 25/00; H01Q 3/00; H01Q 3/24; H01Q 9/00; H01Q 9/145; H03K 17/00; H03K 17/002; H03K 17/6285; H03K 17/693; H03K 17/76

USPC .......................................... 343/876
See application file for complete search history.

(56) References Cited

U.S. PATENT DOCUMENTS

2013/0278317 A1* 10/2013 Iversen .............. H03H 21/0007
327/308
2015/0381168 A1 12/2015 Uejima

FOREIGN PATENT DOCUMENTS

JP 8-213802 8/1996
JP 9-8501 1/1997
JP 2016-10045 1/2016

* cited by examiner

Primary Examiner — Lincoln D Donovan
Assistant Examiner — Dave Mattison
(74) Attorney, Agent, or Firm — Smith, Gambrell & Russell, LLP.

(57) ABSTRACT

A single-pole double-throw switch includes switching units which are set between a first port and a second port and between the first port and a third port, respectively, and are configured to perform complementarily. The each switching unit includes an antenna port, a circuit port, a transmission line configured to couple them, and a switching element connected between the transmission line and a ground. The switching element includes a parallel circuit including a transistor and an inductor connected in parallel, and a capacitor connected in series with the parallel circuit. The transmission line has a characteristic impedance different from a impedance seen inside the switching unit from the antenna port and a impedance seen inside the switching unit from the circuit port.

6 Claims, 12 Drawing Sheets

SINGLE-POLE DOUBLE-THROW SWITCH

TECHNICAL FIELD

An aspect of the present invention relates to a single-pole double-throw switch which selectively inputs and outputs a signal.

BACKGROUND

Conventionally, a single-pole double-throw switch (SPDT) which selectively connects a device for high-frequency signal processing such as an antenna to two input/output terminals has been used. For example, a high frequency switch circuit described in Patent Document 1: Japanese Unexamined Patent Publication No. H8-213802 includes a semiconductor switching element provided between a point on a transmission line connecting two input/output terminals and the ground, a ¼ wavelength line inserted into the transmission line, and an inductive reactance element provided between the point on the transmission line and the ground and configured to constitute a resonant circuit in combination with the semiconductor switching element. As other switch circuits, those described in Patent Document 2: Japanese Unexamined Patent Publication No. H9-008501 and Patent Document 3: Japanese Unexamined Patent Publication No. 2016-010045 are also known.

In the above-described conventional high-frequency switch circuits, there is a tendency for open characteristics and short-circuit characteristics of a transistor serving as a switching element to be biased in high frequency or high power applications. As a result, when a transistor is open, passage loss between terminals may increase significantly. Therefore, a single-pole double-throw switch which can reduce passage loss between terminals when a transistor is open is required.

SUMMARY

According to one aspect of the present invention, there is provided a single-pole double-throw switch including a first port, a second port, a third port, a first switching unit connected between the first port and the second port, and a second switching unit connected between the first port and the third port. The first switching unit includes a first antenna port connected to the first port, a first circuit port connected to the second port, a first transmission line configured to couple the first antenna port to the first circuit port, and a first switching element connected between the first transmission line and ground. The first switching element includes a first parallel circuit including a first transistor and a first inductor connected in parallel with the first transistor, the first parallel circuit being connected to the ground, and a first capacitor connected between the first transmission line and the first parallel circuit. The second switching unit includes a second antenna port connected to the first port, a second circuit port connected to the third port, a second transmission line configured to couple the second antenna port to the second circuit port, and a second switching element connected between the second transmission line and the ground. The second switching element includes a second parallel circuit including a second transistor and a second inductor connected in parallel with the second transistor, the second parallel circuit being connected to the ground, and a second capacitor connected between the second transmission line and the second parallel circuit. The first transmission line has a characteristic impedance different from each of a first impedance seen from the first antenna port and a second impedance seen from the first circuit port, and the second transmission line has a characteristic impedance different from each of the first impedance seen from the second antenna port and a third impedance seen from the second circuit port.

BRIEF DESCRIPTION OF THE DRAWINGS

FIG. 12A is a diagram showing a configuration example of impedance conversion circuits 5a and 9a.

FIG. 12B is a diagram showing a configuration example of the impedance conversion circuits 5a and 9a.

FIG. 12C is a diagram showing a configuration example of the impedance conversion circuits 5a and 9a.

DETAILED DESCRIPTION

Figure 1:
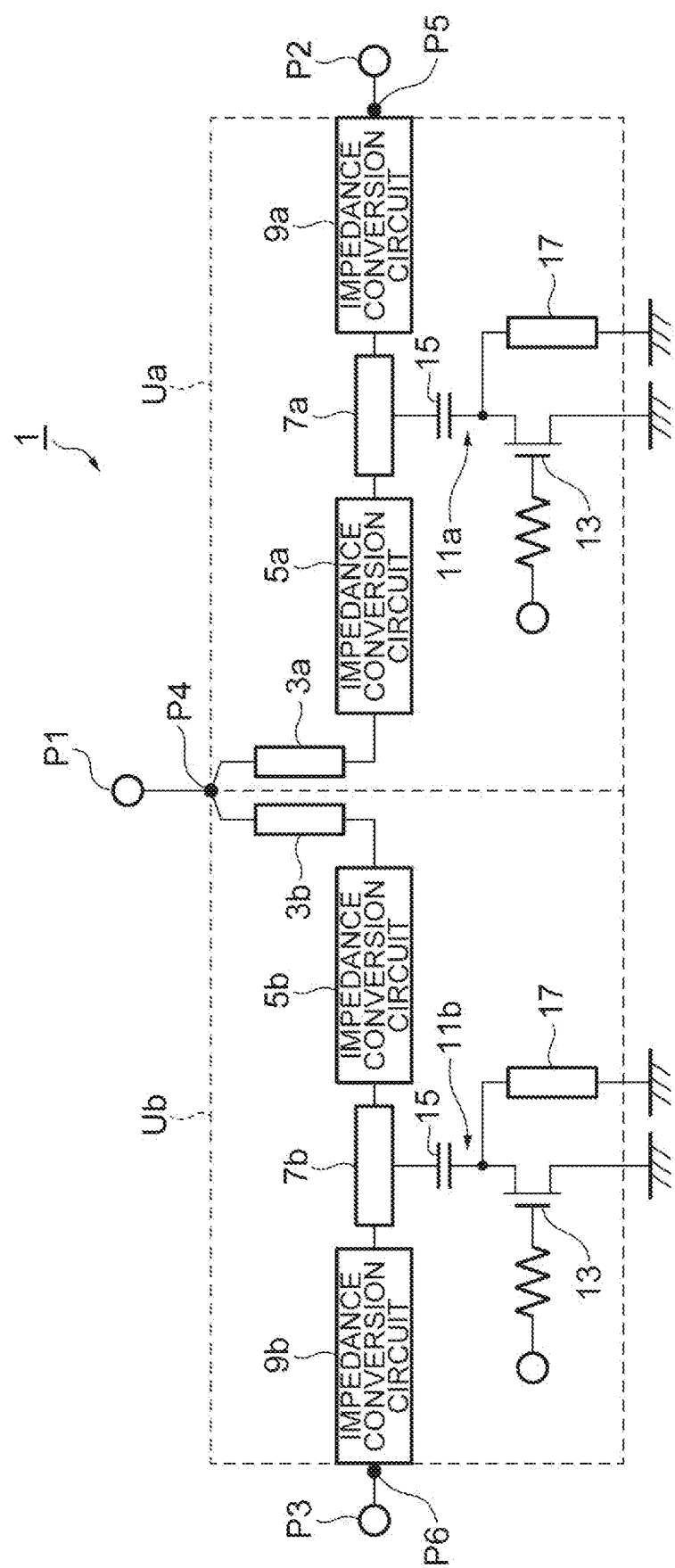
FIG. 1 is a circuit diagram showing a schematic configuration of an SPDT 1 according to an embodiment.

Hereinafter, embodiments of the present invention will be described with reference to the drawings. In the description of the drawings, the same elements are designated by the same reference numerals, and redundant descriptions will be omitted.

[Configuration of Single-Pole Double-Throw Switch]

FIG. 1 is a block diagram showing a configuration of a single-pole double-throw switch (hereinafter referred to as SPDT) according to an embodiment. The SPDT is a switch which can switch an electrical connection between two ports with respect to one port and is used, for example, to switch a connection between a device such as a high-frequency antenna, and a transmitter and a receiver. As shown in FIG. 1, the SPDT 1 includes a first port P1, a second port P2, a third port P3, a switching unit Ua provided between the first port P1 and the second port P2, and a switching unit Ub provided between the first port P1 and the third port P3. The two switching units Ua and Ub are operated complementarily to each other and have the same configuration.

The switching unit Ua includes an antenna port P4 electrically connected directly to the first port P1, a circuit port P5 electrically connected directly to the second port P2, and a transmission line 3a, an impedance conversion circuit 5a, a transmission line 7a, and an impedance conversion circuit 9a connected in this order between the antenna port P4 and the circuit port P5. Further, the switching unit Ua includes a switch element 11a electrically connected between an intermediate connection point on the transmission line 7a and ground (grounding). The switching unit Ub also has a similar configuration between the antenna port P4 and a circuit port P6 which is electrically connected directly to the third port P3 and includes a transmission line 3b, an impedance conversion circuit 5b, a transmission line 7b, an impedance conversion circuit 9b, and a switch element 11b.

The switch element 11a is an element which alternately blocks or conducts between the first port P1 and the second port by conducting (short-circuiting) or breaking (opening) the connection between the transmission line 7a and the ground. The switch element 11a includes a transistor 13 which is an FET, a capacitor 15, and an inductor 17. The transistor 13 can be switched on/off by supplying a gate bias from the outside via a resistance element. A source of the transistor 13 is electrically connected to the ground, and a drain of the transistor 13 is electrically connected to an intermediate point (a connection point) of the transmission line 7a via the capacitor 15 and is also electrically connected to the ground via the inductor 17. In other words, the inductor 17 and the transistor 13 are connected in parallel between the intermediate point of the transmission line 7a and the ground, and a parallel circuit of the transistor 13 and the inductor 17 is connected in series with the capacitor 15.

Figure 2:
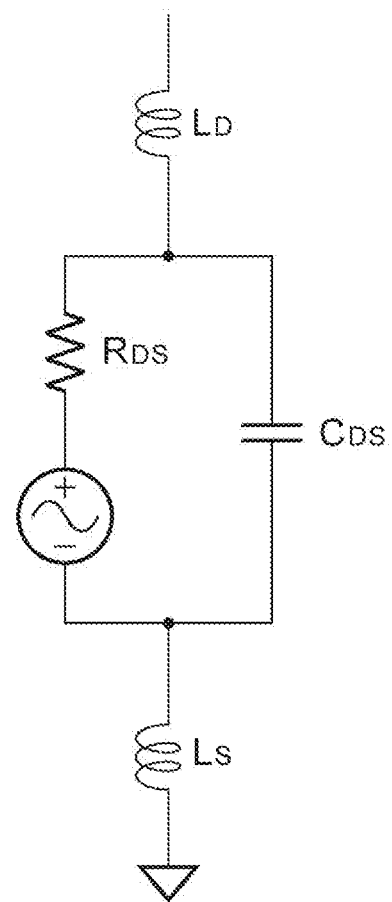
FIG. 2 is an equivalent circuit diagram of a transistor 13 of FIG. 1.

The capacitor 15 and the inductor 17 included in the switch element 11a are provided to compensate for a parasitic inductance and a parasitic capacitance of the transistor 13. FIG. 2 shows an equivalent circuit of the transistor 13. The transistor 13 having a relatively large size (a gate width) has a parasitic capacitance of a capacitance value $C_{DS}$ even when a resistance $R_{DS}$ between the drain and the source has a large value while the transistor 13 is switched off, and particularly in a signal region having a high frequency, an impedance $Z_{DS}$ between the drain and the source has a finite value due to the capacitance value $C_{DS}$, and the transistor 13 cannot be regarded as being off. On the other hand, even when the resistance $R_{DS}$ is small while the transistor 13 is switched on, an inductance component is added to an output of the transistor 13 due to an influence of an inductance $L_D$ of a drain wire and an inductance $L_S$ of a source via. As a result, open (cutoff) characteristics and short circuit (conduction) characteristics of the transistor 13 are biased by magnitudes of the inductances $L_D$ and $L_S$ and the capacitance value $C_{DS}$.

In the embodiment, due to the presence of the inductor 17, an inductor component $L_{DS}$ is interposed in parallel with the parasitic capacitance $C_{DS}$, a peaking circuit is thus formed, and the parasitic capacitance $C_{DS}$ is apparently canceled. In addition, due to the presence of the capacitor 15, the inductance components are apparently canceled by adding capacitance in series to the inductance components of the inductances $L_D$ and $L_S$.

In the transmission line 3a, the impedance conversion circuit 5a, the transmission line 7a, and the impedance conversion circuit 9a connected between the antenna port P4 and the circuit port P5, when a wavelength of a signal targeted by the SPDT 1 is λ, a length from the antenna port P4 to the connection point of the switch element 11a and a length from the circuit port P5 to the connection point of the switch element 11a are set to λ/4. Therefore, when the transistor 13 is switched off, the connection point of the switch element 11a appears to be alternately short-circuited when seen from the side of the antenna port P4 and the circuit port P5, and the antenna port P4 and the circuit port P5 are electrically connected. On the other hand, when the transistor 13 is switched on, the connection point of the switch element 11a appears to be alternately open when seen from the side of the antenna port P4 and the circuit port P5, and the connection between the antenna port P4 and the circuit port P5 is blocked.

The impedance conversion circuits 5a and 9a are provided to correct imbalance of reflection characteristics seen from the drain of the transistor 13 when the transistor 13 of the switch element 11a is switched on/off. Specifically, the impedance conversion circuit 5a performs impedance conversion between a first characteristic impedance in the antenna port P4 and a second characteristic impedance different from the first characteristic impedance. Similarly, the impedance conversion circuit 9a performs impedance conversion between the first characteristic impedance in the circuit port P5 and the second characteristic impedance different from the first characteristic impedance. In the case of the characteristic impedance $Z_0=50\Omega$ in the first port P1 to the third port P3, the characteristic impedance of the transmission line 3a is set to $Z_0$, and the impedance conversion circuits 5a and 9a perform the impedance conversion between the first characteristic impedance $Z_1=Z_0$ and the second characteristic impedance $Z_2$ (for example, $Z_2=21\Omega$). Further, the characteristic impedance of the transmission line 7a is set to the second characteristic impedance $Z_2$ (for example, $Z_2=21\Omega$).

A micro-strip line of which the characteristic impedance is set to a value of a square root $(Z_1 \times Z_2)^{1/2}$ of the product of the first characteristic impedance $Z_1$ and the second characteristic impedance $Z_2$ is employed as a configuration of such impedance conversion circuits 5a and 9a. That is, the impedance conversion circuits 5a and 9a are set to characteristic impedance different from the first characteristic impedance $Z_1$ in which the switching unit Ua is seen from the first port P1 and the second port P2. When the length of the transmission line constituting each of the impedance conversion circuits 5a and 9a is set to λ/4, the transmission lines 3a and 7a are not necessary.

The switching unit Ub has the same configuration as the switching unit Ua, and the transistor 13 of the switch element 11b is exclusively switched on/off with respect to the transistor of the switch element 11a. Accordingly, the electrical connection between the first port P1, the second port P2, and the third port P3 is exclusively switched.

[Characteristics of SPDT]

Next, circuit characteristics of the above-described SPDT 1 will be described.

Figure 3:
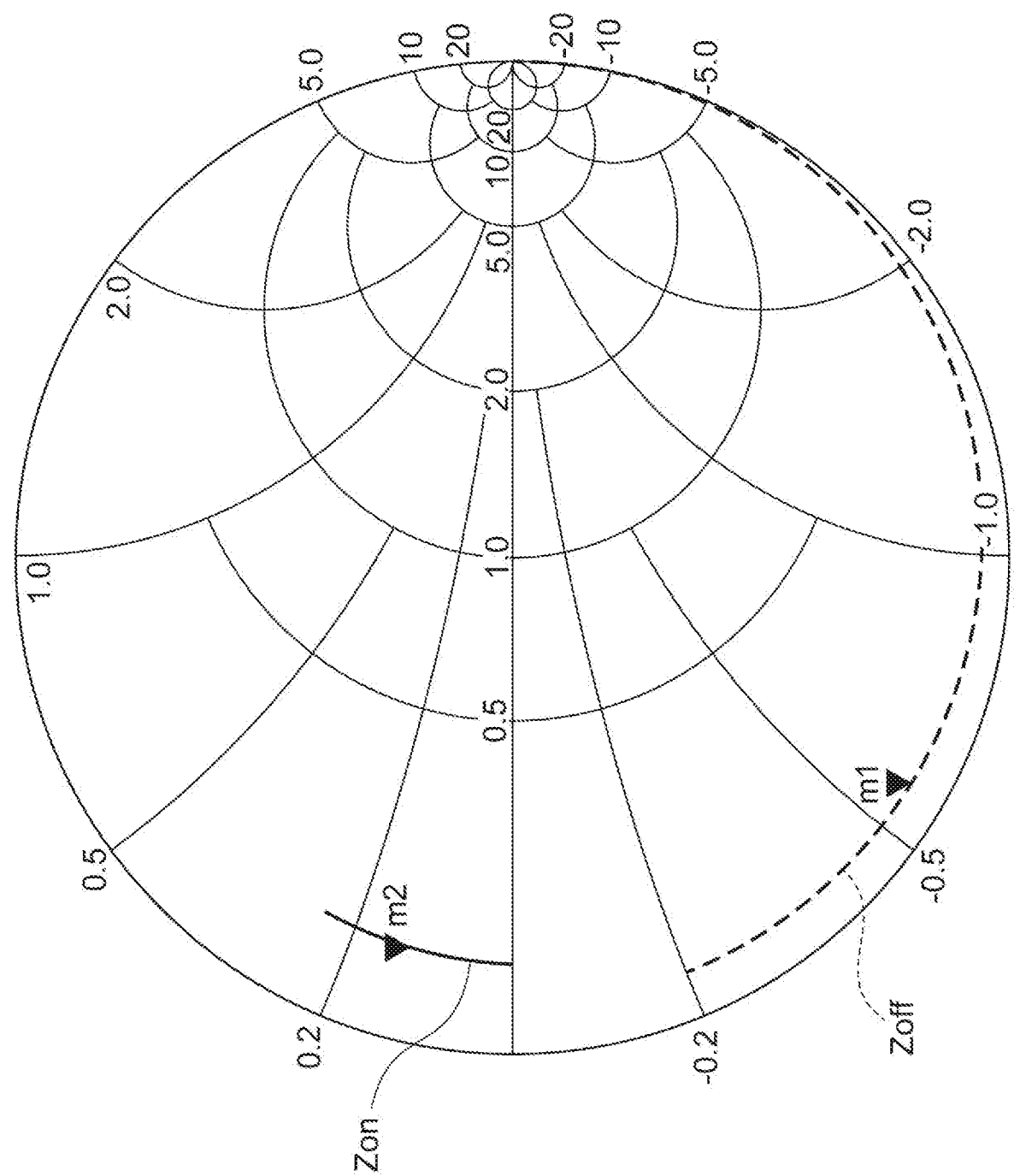
FIG. 3 is a diagram showing a calculation result of an impedance seen from a drain of a general FET on a Smith chart.

First, in FIG. 3, the impedances $Z_{on}$ and $Z_{off}$ seen from the drain at the time of switching-on/off of the transistor 13 configured only with a general FET are calculated in a frequency range of 0.4 to 43.5 GHz and are shown on the Smith chart. Here, the impedance centered on the characteristic impedance $Z_0=50\Omega$ is shown (the same hereinafter unless otherwise specified). As shown in FIG. 3, the impedance characteristic $Z_{off}$ at the time of switching-off of the transistor 13 is in an infinite state at the right end at 0.4 GHz which can be regarded as a direct current, transitions clockwise as the frequency increases, and comes close to a short circuit at the left end at 43.5 GHz. This is because the contribution of the capacitance $C_{DS}$ is larger than that of the inductances $L_D$ and $L_S$. On the other hand, the impedance characteristic $Z_{on}$ at the time of switching-on does not become a complete short-circuit (the left end) at 0.4 GHz due to the contribution of the inductances $L_D$ and $L_S$, but starts from a false short-circuit state and reaches a point closer to the right end due to the contribution of the inductances $L_D$ and $L_S$ in the clockwise direction as the frequency increases. Assuming that a target frequency of the SPDT 1 is 28 GHz, the impedance at that time is calculated as $Z_{on}=Z_0\times(0.106+0.129j)$ and $Z_{off}=Z_0\times(0.059-0.583j)$ (points m2 and m1 on the Smith chart) and does not have values of $Z_{on}$ to 0 and $Z_{off}$ to ∞.

Figure 4:
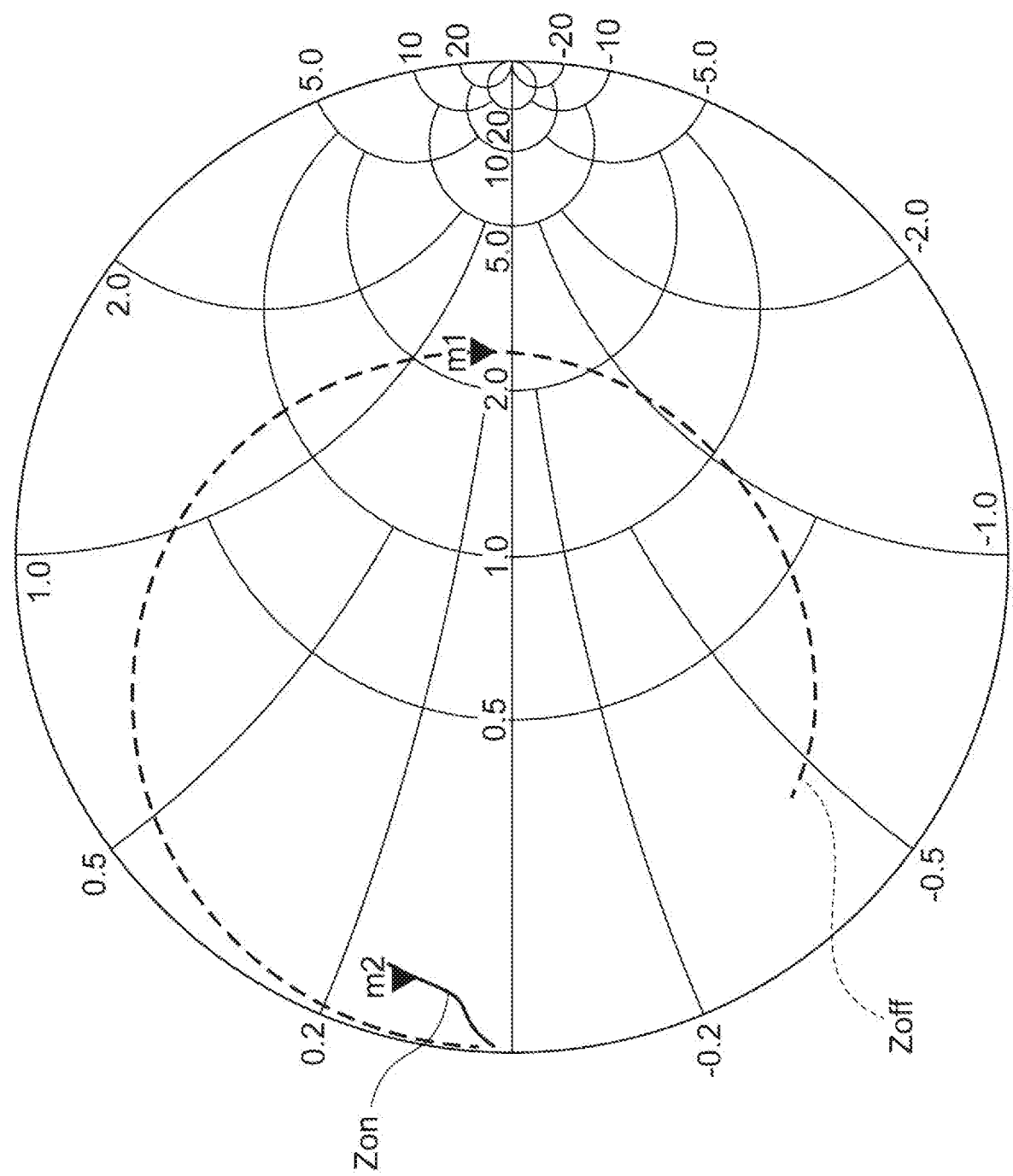
FIG. 4 is a diagram showing a calculation result of an impedance seen from a drain of a transistor 13, to which an inductor 17 is added, on a Smith chart.

In FIG. 4, the impedances $Z_{on}$ and $Z_{off}$ with respect to the transistor 13 in which the inductor 17 is added are calculated in a frequency range of 1 to 40 GHz and shown on the Smith chart. In this case, peaking works at a frequency of $f_0=1/\{2\pi\times(C_{DS}\times L_{DS})^{1/2}\}$. Here, the impedances $Z_{on}$ and $Z_{off}$ when an inductance $L_{DS}$ is set so that the frequency $f_0$ at which the peaking works matches 28 GHz targeted by the SPDT 1 are shown. In this way, the impedance $Z_{off}$ at the time of switching-off is short-circuited at the left end at 1 GHz, calculated as $Z_0\times 2.432$ at 28 GHz (a point m1) and calculated as $Z_0\times(0.25-0.45j)$ at 40 GHz (an end point in the clockwise direction). From this result, it can be understood that the characteristic of the transistor 13 at 28 GHz at the time of switching-off approaches an infinite impedance state due to an effect of the inductor 17.

Figure 5:
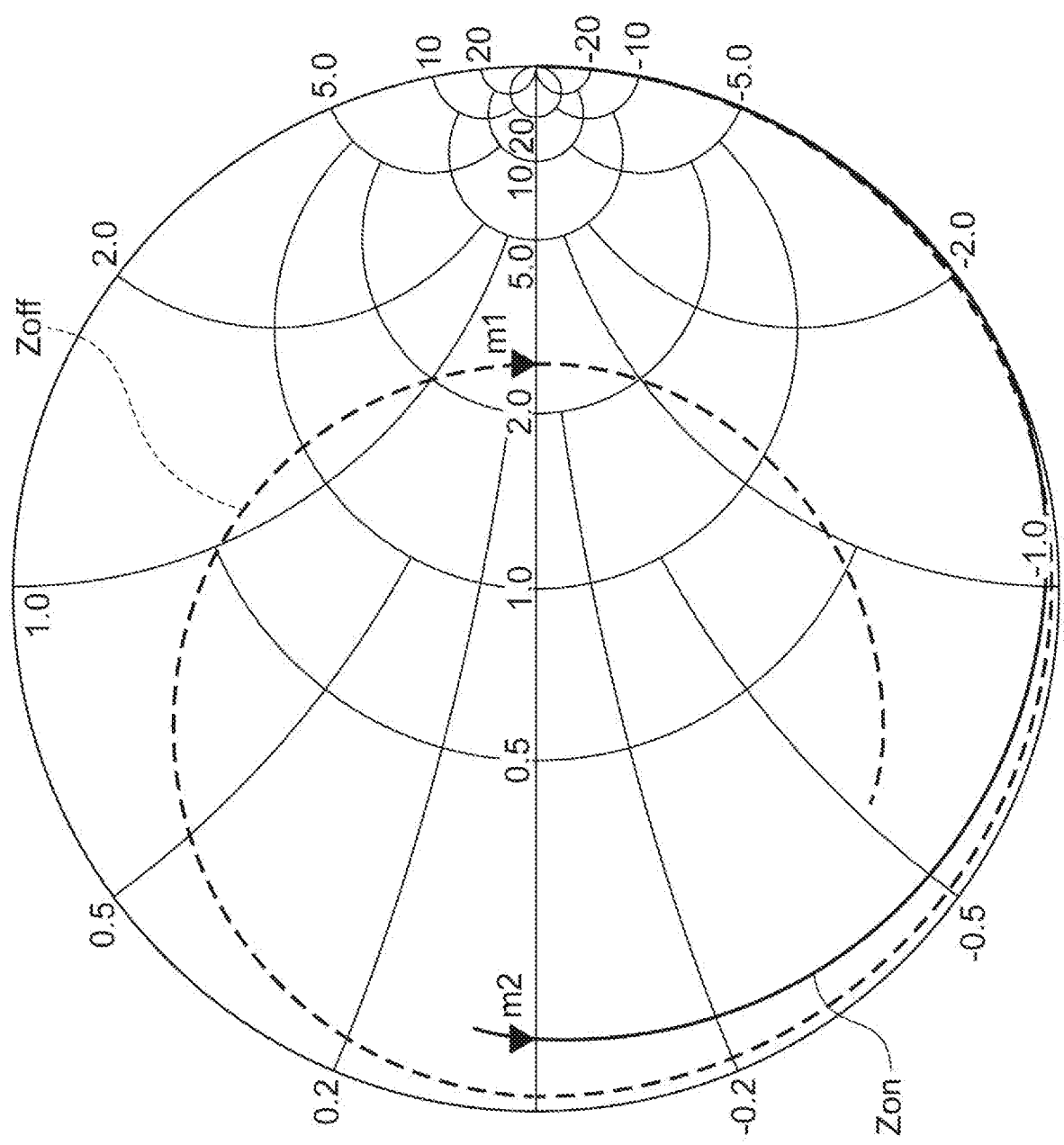
FIG. 5 is a diagram showing a calculation result of an impedance seen from the drain of the transistor 13, to which a capacitor 15 is additionally added, on a Smith chart.

In FIG. 5, the impedances $Z_{on}$ and $Z_{off}$ with respect to the transistor 13 in which the capacitor 15 is additionally added are calculated in a frequency range of 1 to 40 GHz and shown on the Smith chart. When the inductance components $L_D$ and $L_S$ of two parasitic inductors are regarded as one inductance component $L_S'=L_D+L_S$, notching occurs at a frequency of $f_S=(1/2\pi)\times(C_S\div L_S')^{1/2}$ due to an effect of the capacitors 15 connected in series. Here, the impedances $Z_{on}$ and $Z_{off}$ when the capacitance $C_S$ of the capacitor 15 is set to a value that matches the frequency $f_S$ at which notching occurs with 28 GHz targeted by SPDT 1 are shown. In this way, the impedance $Z_{on}$ at the time of switching-on becomes $Z_0\times 0.071$ at a frequency of 28 GHz (a point m2) from a starting point at 1 GHz in the clockwise direction, and is infinite at a frequency of 40 GHz (an end point in the clockwise direction). At this time, the impedance $Z_{off}$ at the time of switching-off is also affected by the capacitor 15, and the characteristic at the frequency of 28 GHz is calculated as $Z_{off}=Z_0\times(2.432-0.122j)$ (a point m1). From this result, it can be understood that the impedance of the transistor 13 at 28 GHz at the time of switching-on approaches a state in which the impedance is zero due to the effect of the capacitor 15.

As described above, although the reflection characteristic seen from the drain when the transistor 13 is switched on/off is improved, values thereof are unbalanced. That is, the reflection characteristic (a reflection coefficient S11) can be evaluated by a distance from an origin ($Z_0=50\Omega$) on the Smith chart shown in FIG. 5, but is $Z_0\times 2.432$ (a point m1) at the time of switching-off and $Z_0\times 0.071$ (a point m2) at the time of switching-on, and the distance from the origin of the points is unbalanced.

Figure 6:
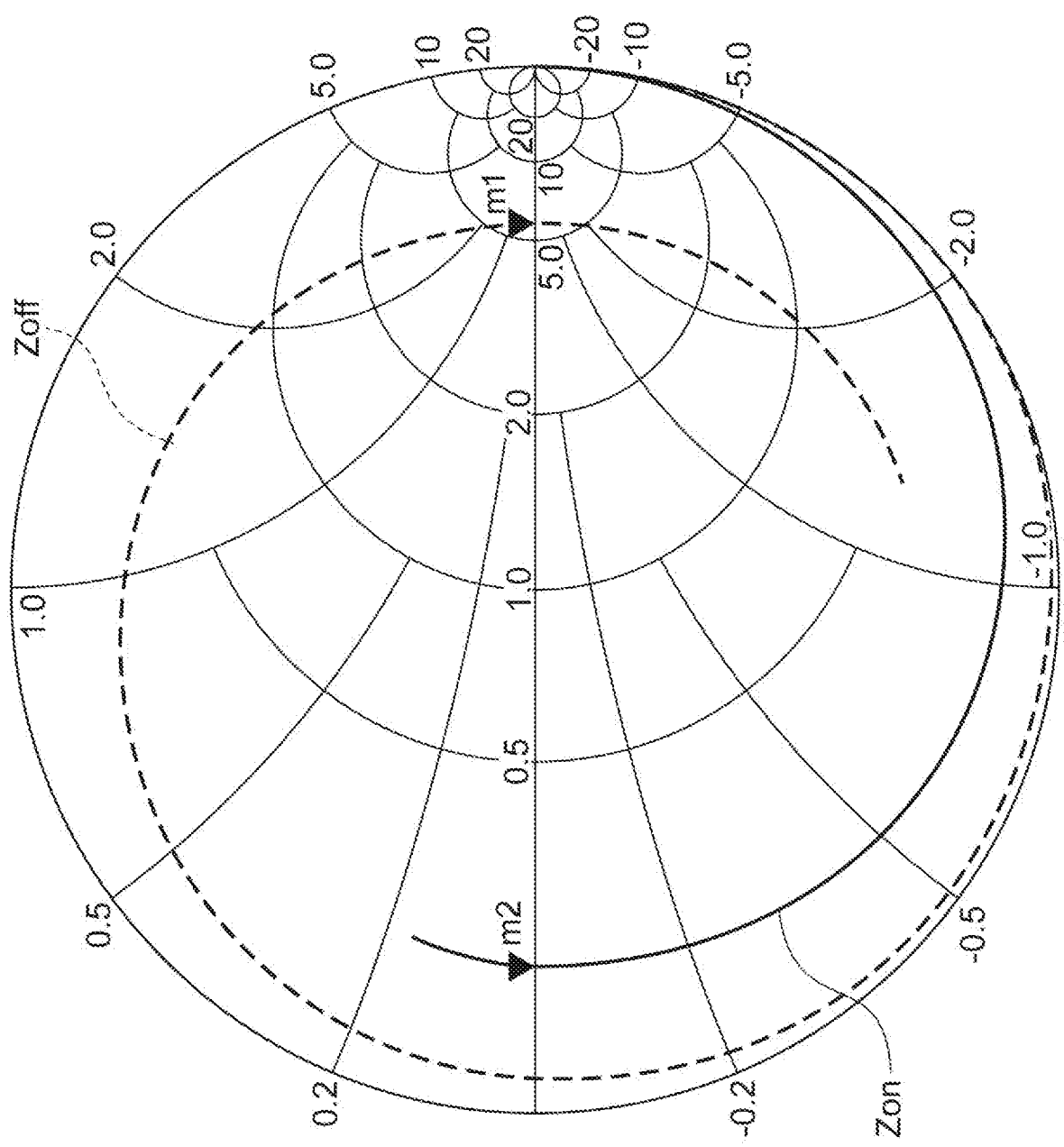
FIG. 6 is a diagram showing a calculation result of an impedance seen from the drain of the transistor 13 on a Smith chart when reflection characteristics are compensated for by the embodiment.

In the embodiment, the reflection characteristics at the time of switching-on/off of the transistor 13 can be set to a similar value by setting a characteristic impedance which compensates for different reflection characteristics on the transmission line to which the drain of the transistor 13 is connected. In FIG. 6, in the SPDT 1 of the embodiment, the impedances $Z_{on}$ and $Z_{off}$ seen from the drain of the transistor 13 are calculated in the frequency range of 1 to 40 GHz and shown on the Smith chart. In the embodiment, since the characteristic impedance in the drain of the transistor 13 is set to a second impedance $Z_2$, the reflection characteristics are evaluated on the Smith chart centered on the impedance $Z_2$. For example, when $Z_2=21\Omega$ is set, as shown in FIG. 6, the characteristics at the points m1 and m2 at the time of switching-on/off of the transistor 13 can be set to symmetrical positions centered on the origin ($Z_2=21\Omega$), and thus the imbalance of the reflection characteristics at the time of switching-on/off of the transistor 13 can be corrected.

Figure 7:
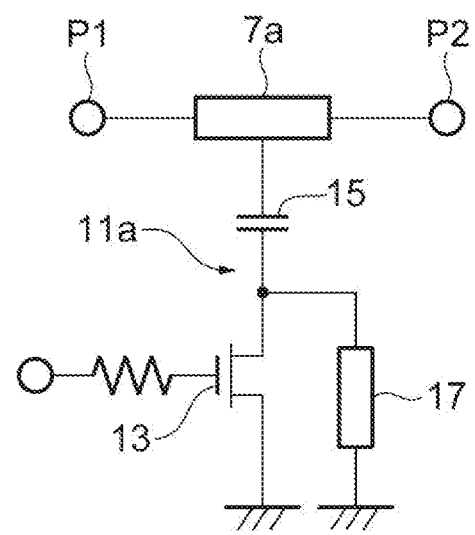
FIG. 7 is a circuit diagram in which a part of the transmission line is removed from a switching unit Ua of FIG. 1.
Figure 8:
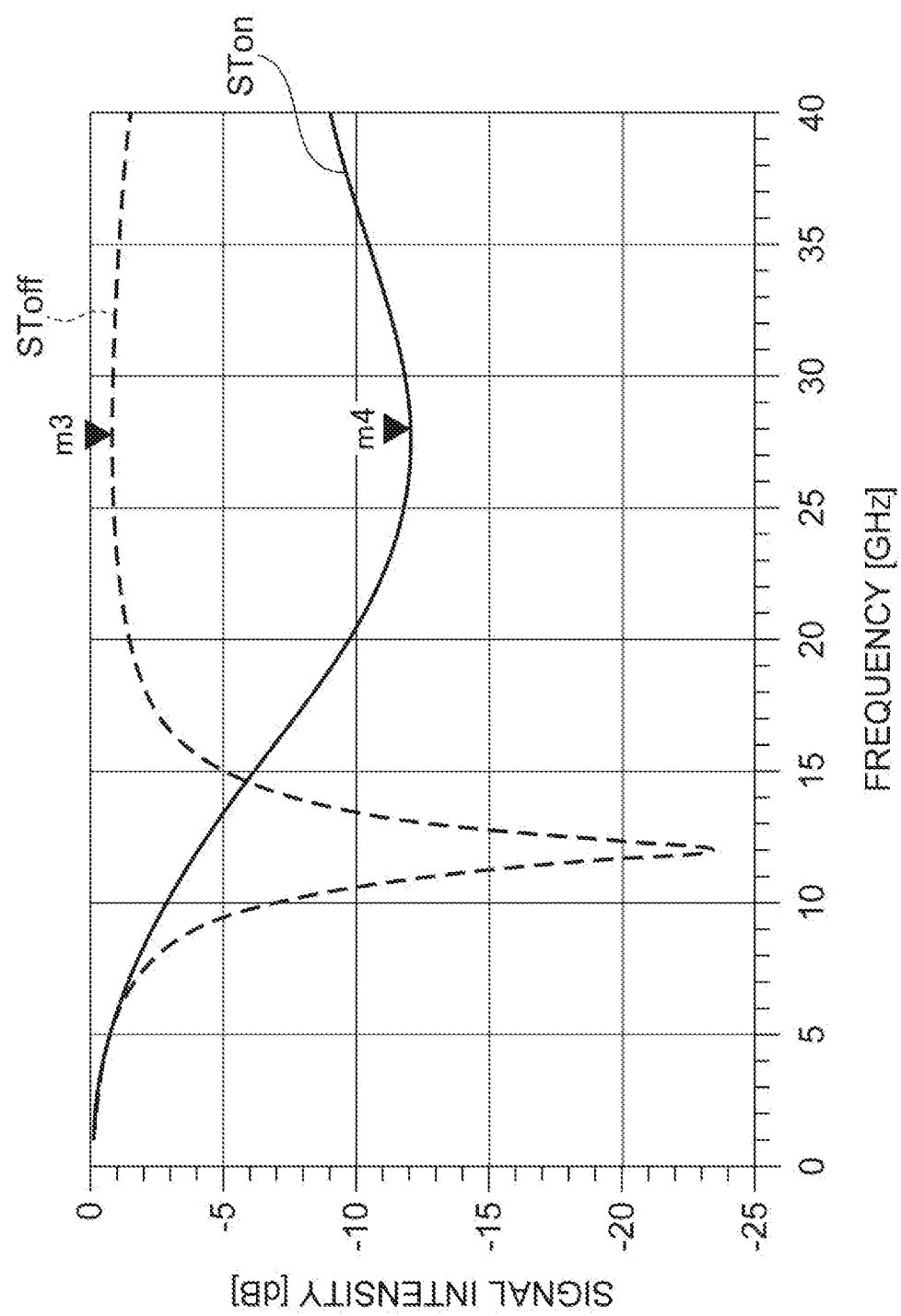
FIG. 8 is a graph showing a result in which the intensity of a signal directed from a first port P1 to a second port P2 is calculated at various frequencies in the configuration shown in FIG. 7.

FIG. 7 shows a configuration in which the transmission line 3a and the impedance conversion circuits 5a and 9a are removed from the switching unit Ua. FIG. 8 shows a result in which the intensity of a signal directed from the first port P1 to the second port P2 is calculated at various frequencies in the configuration shown in FIG. 7. Here, a gate width of the transistor 13 is 400 μm, the capacitance of the capacitor 15 is set to $C_S=1$ pF, the inductor 17 has a width of 10 μm and a length of 400 μm, the strength at the time of switching-off of the transistor 13 is indicated by a curve SToff, and the strength at the time of switching-on of the transistor 13 is indicated by a curve STon. From this result, the loss at a frequency of 27.7 GHz at the time of switching-off of the transistor 13 is calculated as 0.714 dB (a point m3), the loss at the same frequency at the time of switching-on of the transistor 13 is calculated as 11.275 dB (a point m4), and a value of an intensity ratio of 10 dB or more at the time of switching-on/off is obtained.

Figure 9:
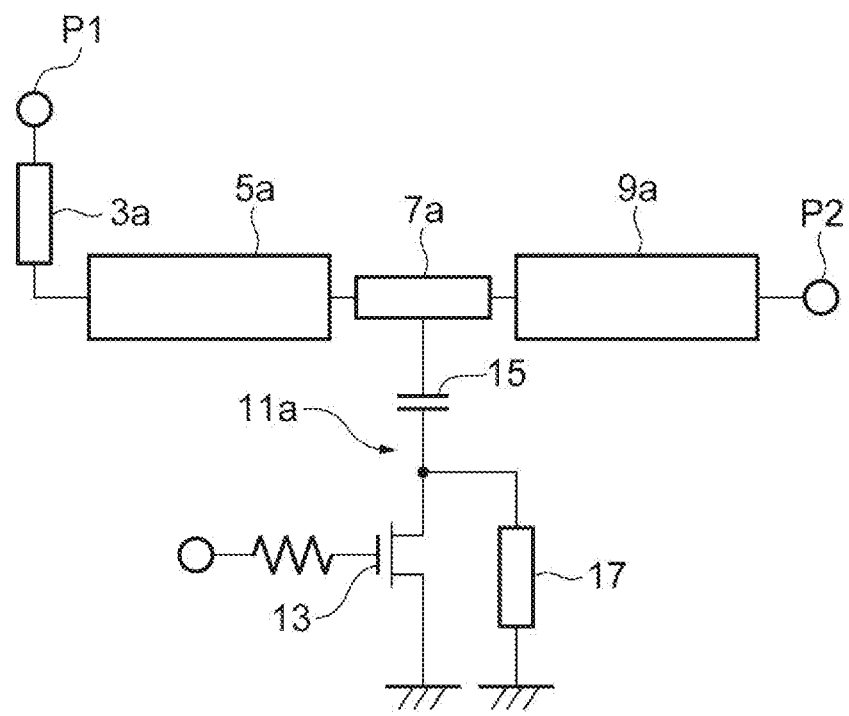
FIG. 9 is a circuit diagram of the switching unit Ua of FIG. 1.

However, the configuration shown in FIG. 7 cannot be used as a switch on one side of the SPDT 1 as it is. This is because the impedance of a transmission path is not 50Ω, and the impedance of the first port P1 is not open at the time of switching-on of the transistor 13 (when the signal is blocked), and thus a signal to be propagated to the transmission path on the other side may also be blocked. Therefore, the SPDT 1 employs the configuration shown in FIG. 9. In the embodiment, the transmission line 3a is provided to open the first port P1 by adjusting the length of the transmission line when the impedance conversion circuits 5a and 9a and the transistor 13 are short-circuited. That is, when the transistor 13 is switched on, since the length from a intermediate connection point of the transmission line 7a to the first port P1 is set to λ/4, the impedance seen from the first port P1 may be opened so that the switching unit on the other side is not affected.

Figure 10:
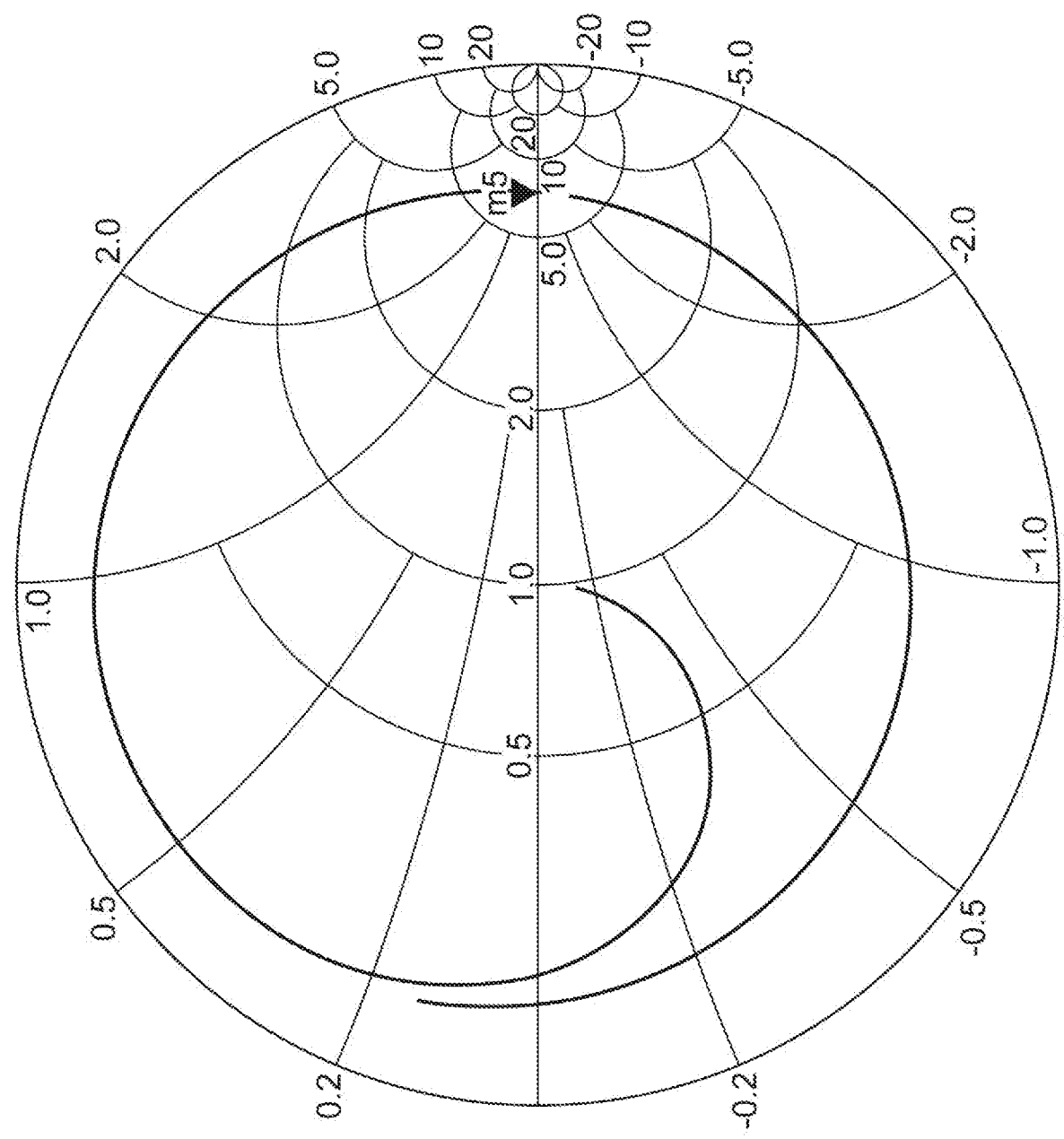
FIG. 10 is a diagram showing a calculation result of an impedance seen from the first port P1 on a Smith chart in the embodiment.

In FIG. 10, in the embodiment, a result in which the impedance seen from the first port P1 at the time of switching-on of the transistor 13 is calculated in the frequency range of 0.4 to 45.5 GHz is shown on the Smith chart. Here, it is shown on the Smith chart centered on the characteristic impedance $Z_0=50\Omega$. As described above, it is located at approximately the origin at a frequency of 0.4 GHz, and the characteristic impedance 50Ω on the second port P2 is directly observed, transitions clockwise as the frequency increases, becomes the impedance $Z_0\times(7.188-0.454j)$ at a frequency of 28 GHz (a point m5), and becomes the impedance $Z_0\times(0.15+0.15j)$ at a frequency of 45.5 GHz (an end point).

Figure 11:
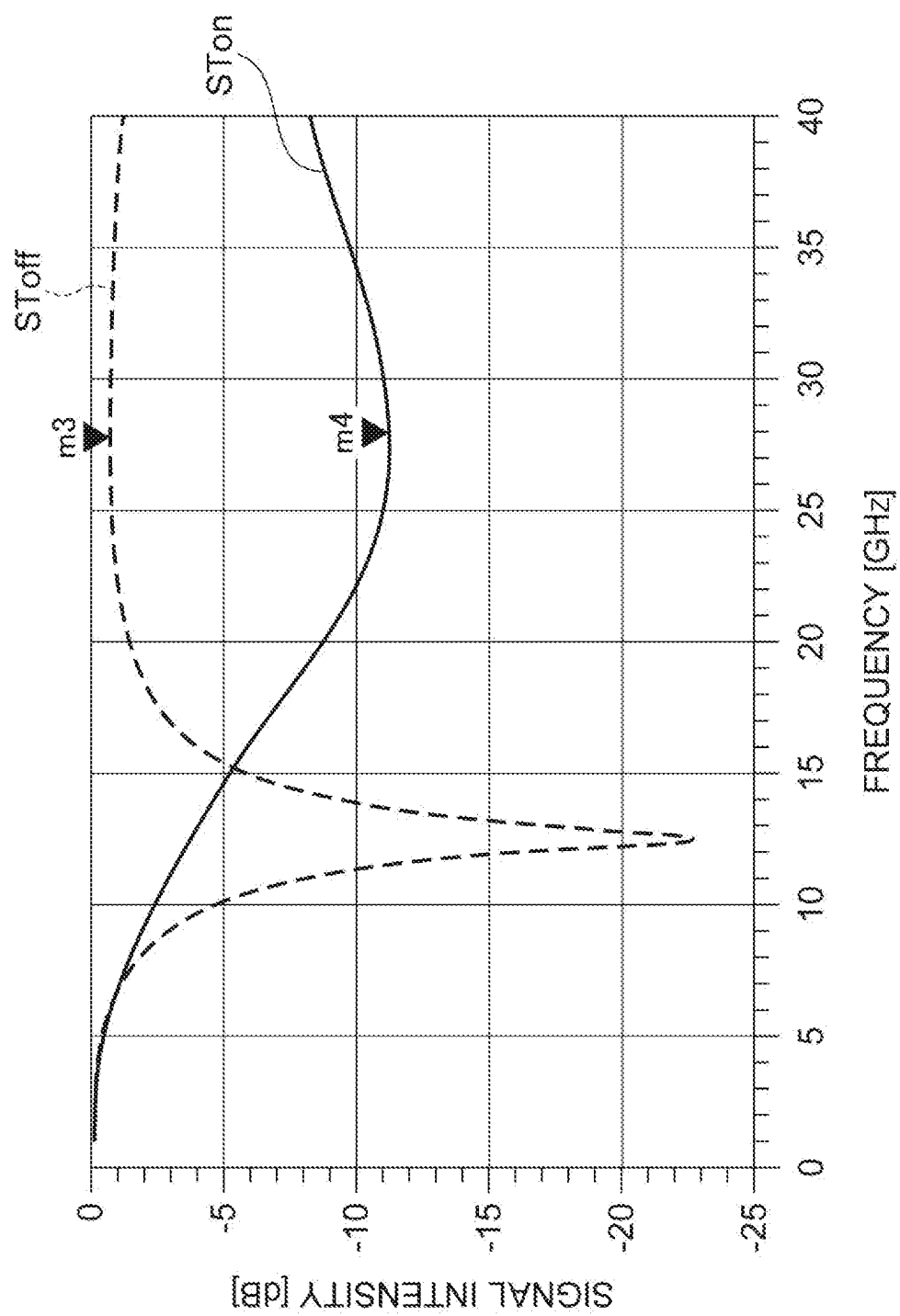
FIG. 11 is a graph showing a result in which the intensity of a signal directed from the first port P1 to the second port P2 is calculated at various frequencies in the configuration shown in FIG. 9.

FIG. 11 shows a result in which the intensity of a signal directed from the first port P1 toward the second port P2 is calculated at various frequencies in the embodiment. Here, the strength at the time of switching-off of the transistor 13 is indicated by a curve SToff, and the strength at the time of switching-on of the transistor 13 is indicated by a curve STon. From this result, the loss at a frequency of 28 GHz at the time of switching-off of the transistor 13 is calculated as 0.655 dB (a point m3), the loss at the same frequency at the time of switching-on of the transistor 13 is calculated as 11.275 dB (a point m4), and a value of an intensity ratio of 10 dB or more at the time of switching-on/off is obtained.

[Operation and Effect of SPDT]

According to the SPDT 1 of the above-described embodiment, when the transistor 13 is switched on, the parasitic inductance component is canceled by the capacitor 15 of the switch element 11a, and when the transistor 13 is switched off, the parasitic capacitance component is canceled by the inductor 17 of the switch element 11a. In addition, due to the presence of the impedance conversion circuits 5a and 9a having characteristic impedance different from the first impedance $Z_0$ in which the inside of the switching unit Ua is seen, it is possible to uniformize the reflection characteristics in which the switching unit Ua is seen from the ports P1 and P2 when the transistor 13 is switched on/off. As a result, passage loss between the ports can be reduced when the transistor 13 is switched off (opened), between the first port P, and the second port P2 and the third port P3.

In particular, the characteristic impedances of the impedance conversion circuits 5a and 9a are set to values of the square root of the product of the first characteristic impedance $Z_1$ and the second characteristic impedance $Z_2$. According to such impedance conversion circuits 5a and 9a, the characteristic impedance can be converted between the first characteristic impedance and the second characteristic impedance with a simple configuration.

Further, according to the embodiment, the impedance of the switch element 11a at the time of switching-on of the transistor 13 and the impedance of the switch element 11a at the time of switching-off of the transistor 13 are values indicating symmetrical points with respect to the frequency of the signal targeted by SPDT 1 on the Smith chart with the second characteristic impedance $Z_2$ as a reference. With such a configuration, it is possible to uniformize the reflection characteristics in which the switching unit Ua is seen from each of the ports P1 and P2 when the transistor 13 is switched on/off.

Further, when a wavelength of the signal targeted by the SPDT 1 is $\lambda$, the transmission line in the switching unit Ua has a length of $\lambda/4$ from the antenna port P4 or the circuit port P5 to the connection point on the transmission line 7a. With such a configuration, when the transistor 13 is switched on, the connection with the circuit port P5 side can be blocked in a high frequency manner when seen from the antenna port P4 side, and when the transistor 13 is switched off, the connection with the circuit port P5 side can be conducted in a high frequency manner when seen from the antenna port P4 side.

Although the principle of the present invention has been illustrated and described in a preferred embodiment, it will be appreciated by those skilled in the art that the present invention may be modified in arrangement and detail without departing from such a principle. The present invention is not limited to the specific configuration disclosed in the embodiment. Therefore, all modifications and changes coining from the claims and from the spirit thereof are claimed.

Figure 12A:
Figure 12B:
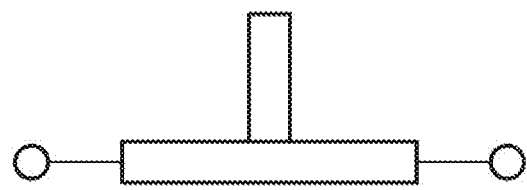
Figure 12C:
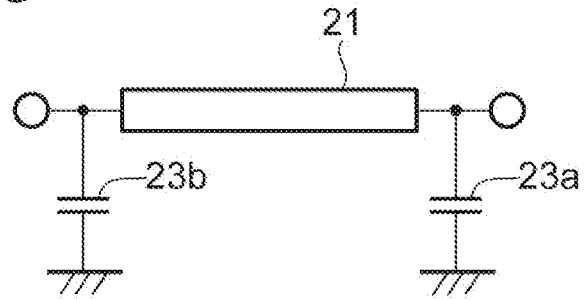

In the embodiment, the configuration of the impedance conversion circuits 5a and 9a is exemplified as a micro-strip line as shown in FIG. 12A, but other configurations may be used. For example, an impedance converter using a transmission line having the characteristic impedance $Z_0$ having a stub as shown in FIG. 12B may be used, and a π-type impedance converter having a configuration in which two capacitors 23a and 23b are connected between both ends of the inductor 21 and the ground as shown in FIG. 12C may be used. However, in the case of such a configuration, it is necessary to set the length of the transmission line 3a so that the impedance of the first port P1 is high when the transistor 13 is switched on.

What is claimed is:

1. A single-pole double-throw switch comprising:
a first port;
a second port;
a third port;
a first switching unit connected between the first port and the second port, the first switching unit including:
an antenna port connected to the first port,
a first circuit port connected to the second port,
a first transmission line configured to couple the antenna port to the first circuit port, and
a first switching element connected between the first transmission line and ground, the first switching element including:
a first parallel circuit including a first transistor and a first inductor connected in parallel with the first transistor, the first parallel circuit being connected to ground, and
a first capacitor connected between the first transmission line and the first parallel circuit, and
a second switching unit connected between the first port and the third port, the second switching unit including:
an antenna port connected to the first port,
a second circuit port connected to the third port,
a second transmission line configured to couple the antenna port of the second switching unit to the second circuit port; and
a second switching element connected between the second transmission line and ground, the second switching element including:
a second parallel circuit including a second transistor and a second inductor connected in parallel with the second transistor, the second parallel circuit being connected to ground, and
a second capacitor connected between the second transmission line and the second parallel circuit,
wherein the first transmission line has a characteristic impedance different from each of a first impedance as seen from the antenna port of the first switching unit and a second impedance as seen from the first circuit port,
wherein the second transmission line has a characteristic impedance different from each of the first impedance as seen from the antenna port of the second switching unit and a third impedance as seen from the second circuit port,
wherein the first transmission line is configured to perform impedance matching between a first characteristic impedance of the antenna port of the first switching unit and the first circuit port and a second characteristic impedance different from the first characteristic impedance at a connection point of the first switching element, and a length between the antenna port of the first switching unit and the first circuit port and the connection point is a length of $\lambda/4$ when a wavelength of a signal targeted by the single-pole double-throw switch is $\lambda$,
wherein the second transmission line is configured to perform impedance matching between a first characteristic impedance of the antenna port of the second switching unit and the second circuit port and a second characteristic impedance different from the first characteristic impedance at a connection point of the second switching element, and a length between the antenna port of the second switching unit and the second circuit port and the connection point is a length of $\lambda/4$ when a wavelength of a signal targeted by the single-pole double-throw switch is $\lambda$, wherein the first transmission line includes:
- a first transmission line part connected to the antenna port of the first switching unit and having the first characteristic impedance,
- a first impedance conversion circuit connected to the first transmission line part and configured to perform impedance matching between the first characteristic impedance of the first transmission line part and the second characteristic impedance,
- a second transmission line part having the second characteristic impedance, and connected to the first impedance conversion circuit, and
- a second impedance conversion circuit connected between the second transmission line part and the first circuit port and configured to perform the impedance matching between the first characteristic impedance and the second characteristic impedance, wherein the second transmission line includes:
- a third transmission line part connected to the antenna port of the second switching unit and having the first characteristic impedance,
- a third impedance conversion circuit connected to the third transmission line part and configured to perform impedance matching between the first characteristic impedance of the third transmission line part and the second characteristic impedance,
- a fourth transmission line part having the second characteristic impedance, and connected to the third impedance conversion circuit, and
- a fourth impedance conversion circuit connected between the fourth transmission line part and the second circuit port and configured to perform the impedance matching between the first characteristic impedance and the second characteristic impedance, wherein the first switching element is connected to the second transmission line part, wherein the second switching element is connected to the fourth transmission line part, wherein the first, second, third, and fourth impedance conversion circuits are set to a characteristic impedance which is a value of a square root of a product of the first characteristic impedance and the second characteristic impedance, and wherein the first, second, third and fourth impedance conversion circuits are stub circuits.

2. The single-pole double-throw switch according to claim 1, wherein a characteristic impedance of each of the first transmission line and the second transmission line has a value that is the square root of a product of the first characteristic impedance and the second characteristic impedance.

3. The single-pole double-throw switch according to claim 1, wherein an impedance of the first switching element when the first transistor is conductive and an impedance of the first switching element when the first transistor is non-conductive are set at a point-symmetrical position in a frequency of the signal targeted by the single-pole double-throw switch on a Smith chart with the second characteristic impedance as a reference, and an impedance of the second switching element when the second transistor is conductive and an impedance of the second switching element when the second transistor is non-conductive are set at a point-symmetrical position in a frequency of the signal targeted by the single-pole double-throw switch on a Smith chart with the second characteristic impedance as a reference.

4. A single-pole double-throw switch comprising:
a first port;
a second port;
a third port;
a first switching unit connected between the first port and the second port, the first switching unit including:
- an antenna port connected to the first port,
- a first circuit port connected to the second port,
- a first transmission line configured to couple the antenna port to the first circuit port, and
- a first switching element connected between the first transmission line and ground, the first switching element including:
  - a first parallel circuit including a first transistor and a first inductor connected in parallel with the first transistor, the first parallel circuit being connected to ground, and
  - a first capacitor connected between the first transmission line and the first parallel circuit and
a second switching unit connected between the first port and the third port, the second switching unit including:
- an antenna port connected to the first port,
- a second circuit port connected to the third port,
- a second transmission line configured to couple the antenna port of the second switching unit to the second circuit port, and
- a second switching element connected between the second transmission line and ground, the second switching element including:
  - a second parallel circuit including a second transistor and a second inductor connected in parallel with the second transistor, the second parallel circuit being connected to the ground, and
  - a second capacitor connected between the second transmission line and the second parallel circuit, wherein the first transmission line has a characteristic impedance different from each of a first impedance as seen from the antenna port of the first switching unit and a second impedance as seen from the first circuit port, wherein the second transmission line has a characteristic impedance different from each of the first impedance as seen from the antenna port of the second switching unit and a third impedance as seen from the second circuit port, wherein the first transmission line is configured to perform impedance matching between a first characteristic impedance of the antenna port of the first switching unit and the first circuit port and a second characteristic impedance different from the first characteristic impedance at a connection point of the first switching element, and a length between the antenna port of the first switching unit and the first circuit port and the connection point is a length of $\lambda/4$ when a wavelength of a signal targeted by the single-pole double-throw switch is $\lambda$, wherein the second transmission line is configured to perform impedance matching between a first characteristic impedance of the antenna port of the second switching unit and the second circuit port and a second characteristic impedance different from the first characteristic impedance at a connection point of the second switching element, and a length between the antenna port of the second switching unit and the second circuit port and the connection point is a length of λ/4 when a wavelength of a signal targeted by the single-pole double-throw switch is λ, wherein the first transmission line includes:
- a first transmission line part connected to the antenna port of the first switching unit and having the first characteristic impedance,
- a first impedance conversion circuit connected to the first transmission line part and configured to perform impedance matching between the first characteristic impedance of the first transmission line part and the second characteristic impedance,
- a second transmission line part having the second characteristic impedance, and connected to the first impedance conversion circuit, and
- a second impedance conversion circuit connected between the second transmission line part and the first circuit port and configured to perform the impedance matching between the first characteristic impedance and the second characteristic impedance, wherein the second transmission line includes:
- a third transmission line part connected to the antenna port of the second switching unit and having the first characteristic impedance,
- a third impedance conversion circuit connected to the third transmission line part and configured to perform impedance matching between the first characteristic impedance of the third transmission line part and the second characteristic impedance,
- a fourth transmission line part having the second characteristic impedance, and connected to the third impedance conversion circuit, and
- a fourth impedance conversion circuit connected between the fourth transmission line part and the second circuit port and configured to perform the impedance matching between the first characteristic impedance and the second characteristic impedance, wherein the first switching element is connected to the second transmission line part, wherein the second switching element is connected to the fourth transmission line part, wherein the first, second, third, and fourth impedance conversion circuits are set to a characteristic impedance which is a value of a square root of a product of the first characteristic impedance and the second characteristic impedance, and wherein the first, second, third and fourth impedance conversion circuits are π-type impedance converters.

5. The single-pole double-throw switch according to claim 4, wherein a characteristic impedance of each of the first transmission line and the second transmission line has a value that is the square root of a product of the first characteristic impedance and the second characteristic impedance.

6. The single-pole double-throw switch according to claim 4, wherein an impedance of the first switching element when the first transistor is conductive and an impedance of the first switching element when the first transistor is non-conductive are set at a point-symmetrical position in a frequency of the signal targeted by the single-pole double-throw switch on a Smith chart with the second characteristic impedance as a reference, and an impedance of the second switching element when the second transistor is conductive and an impedance of the second switching element when the second transistor is non-conductive are set at a point-symmetrical position in a frequency of the signal targeted by the single-pole double-throw switch on a Smith chart with the second characteristic impedance as a reference.

* * * * *